(12) United States Patent
Yang

(10) Patent No.: US 11,069,646 B2
(45) Date of Patent: Jul. 20, 2021

(54) PRINTED CIRCUIT BOARD STRUCTURE HAVING PADS AND CONDUCTIVE WIRE

(71) Applicant: NANYA TECHNOLOGY CORPORATION, New Taipei (TW)

(72) Inventor: Wu-Der Yang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/583,289

(22) Filed: Sep. 26, 2019

(65) Prior Publication Data
US 2021/0098413 A1    Apr. 1, 2021

(51) Int. Cl.
*H01L 23/12*    (2006.01)
*H01L 23/00*    (2006.01)

(52) U.S. Cl.
CPC ............. *H01L 24/48* (2013.01); *H01L 24/06* (2013.01); *H01L 24/45* (2013.01); *H01L 2224/04042* (2013.01); *H01L 2224/0603* (2013.01); *H01L 2224/06517* (2013.01); *H01L 2224/45144* (2013.01); *H01L 2224/4813* (2013.01); *H01L 2224/48227* (2013.01); *H01L 2224/48991* (2013.01)

(58) Field of Classification Search
CPC ......... H01L 24/06; H01L 24/45; H01L 25/48; H01L 24/85
See application file for complete search history.

(56) References Cited

U.S. PATENT DOCUMENTS

| 8,685,791 | B2 * | 4/2014 | Luechinger | H01L 23/498 438/106 |
| 2009/0108425 | A1 * | 4/2009 | Lee | H01L 25/0657 257/679 |
| 2012/0119387 | A1 * | 5/2012 | Katagiri | H01L 24/49 257/777 |
| 2014/0021608 | A1 * | 1/2014 | Choi | H01L 23/49816 257/738 |
| 2017/0186680 | A1 * | 6/2017 | Nishimura | H01L 23/13 |

FOREIGN PATENT DOCUMENTS

TW    557518    10/2003

\* cited by examiner

*Primary Examiner* — Suberr L Chi
(74) *Attorney, Agent, or Firm* — CKC & Partners Co., LLC

(57) ABSTRACT

The disclosure provides a printed circuit board structure. The printed circuit board structure includes a printed circuit board, a semiconductor chip, a first pad, a second pad, a conductive wire, and a third pad. The semiconductor chip is disposed on the printed circuit board. The first pad is disposed on the semiconductor chip. The second pad is disposed on the printed circuit board. The conductive wire electrically connects the first pad and the second pad. The third pad is disposed between the first pad and the second pad. The conductive wire has a portion located on the third pad.

15 Claims, 5 Drawing Sheets

PRINTED CIRCUIT BOARD STRUCTURE HAVING PADS AND CONDUCTIVE WIRE

BACKGROUND

Technical Field

The present disclosure relates to a printed circuit board (PCB) structure.

Description of Related Art

Integrated circuit (IC) devices are typically manufactured in a semiconductor chip. The semiconductor chip typically has a two-dimensional array of numerous IC devices therein. Bonding pads are disposed on the semiconductor chip for electrical connection of conductive wires and the IC devices. The bonding pads are usually made of aluminum or copper and deployed on the top surface of the semiconductor chip.

As the circuits of the IC devices become more and more complicated, long conductive wires are used in a three-dimension IC (3DIC) package. However, the long conductive wire causes a conductive wire crossing problem and low yield due to a wire-to-wire short, such that the performance of a printed circuit board (PCB) and the IC devices on the PCB are reduced.

SUMMARY

According to one embodiment of the present disclosure, a printed circuit board structure includes a printed circuit board, a semiconductor chip, a first pad, a second pad, a conductive wire, and a third pad. The semiconductor chip is disposed on the printed circuit board. The first pad is disposed on the semiconductor chip. The second pad is disposed on the printed circuit board. The conductive wire electrically connects the first pad and the second pad. The third pad is disposed between the first pad and the second pad. The conductive wire has a portion located on the third pad.

In some embodiments of the present disclosure, a distance between the first pad and the third pad is substantially equal to a distance between the second pad and the third pad in a horizontal direction.

In some embodiments of the present disclosure, the third pad is disposed on the semiconductor chip.

In some embodiments of the present disclosure, the second pad is electrically connected to the printed circuit board.

In some embodiments of the present disclosure, the first pad is electrically connected to the semiconductor chip.

In some embodiments of the present disclosure, the third pad is electrically isolated from the conductive wire.

In some embodiments of the present disclosure, the third pad is electrically isolated from the semiconductor chip.

In some embodiments of the present disclosure, a top surface of the third pad is substantially coplanar with a top surface of the first pad.

In some embodiments of the present disclosure, a top surface of the third pad is higher than a top surface of the second pad.

In some embodiments of the present disclosure, the portion of the conductive wire is in contact with the third pad.

In some embodiments of the present disclosure, the third pad is a colloid.

In some embodiments of the present disclosure, the colloid is a double sided tape.

In some embodiments of the present disclosure, the third pad has a thickness less than the first pad.

In some embodiments of the present disclosure, the conductive wire is made of a material comprising gold.

According to one embodiment of the present disclosure, a printed circuit board structure includes a printed circuit board, a semiconductor chip, a first pad, a second pad, a conductive wire. The semiconductor chip is disposed on the printed circuit board. The first pad disposed on the semiconductor chip. The second pad is disposed on the printed circuit board. The conductive wire electrically connects the first pad and the second pad, and has a portion fixed on the semiconductor chip.

In some embodiments of the present disclosure, the printed circuit board structure further includes an adhesive tape on the semiconductor chip and overlapping the portion of the conductive wire.

In some embodiments of the present disclosure, a distance between the first pad and the portion of the conductive wire is substantially equal to a distance between the second pad and the portion of the conductive wire in a horizontal direction.

In the aforementioned embodiments, since the conductive wire of the printed circuit board structure has a portion located on the third pad instead of floating above the semiconductor chip, the conductive wire crossing problem and the wire-to-wire short can be solved. As a result, the signal and the performance of the printed circuit board (PCB) structure can be improved.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
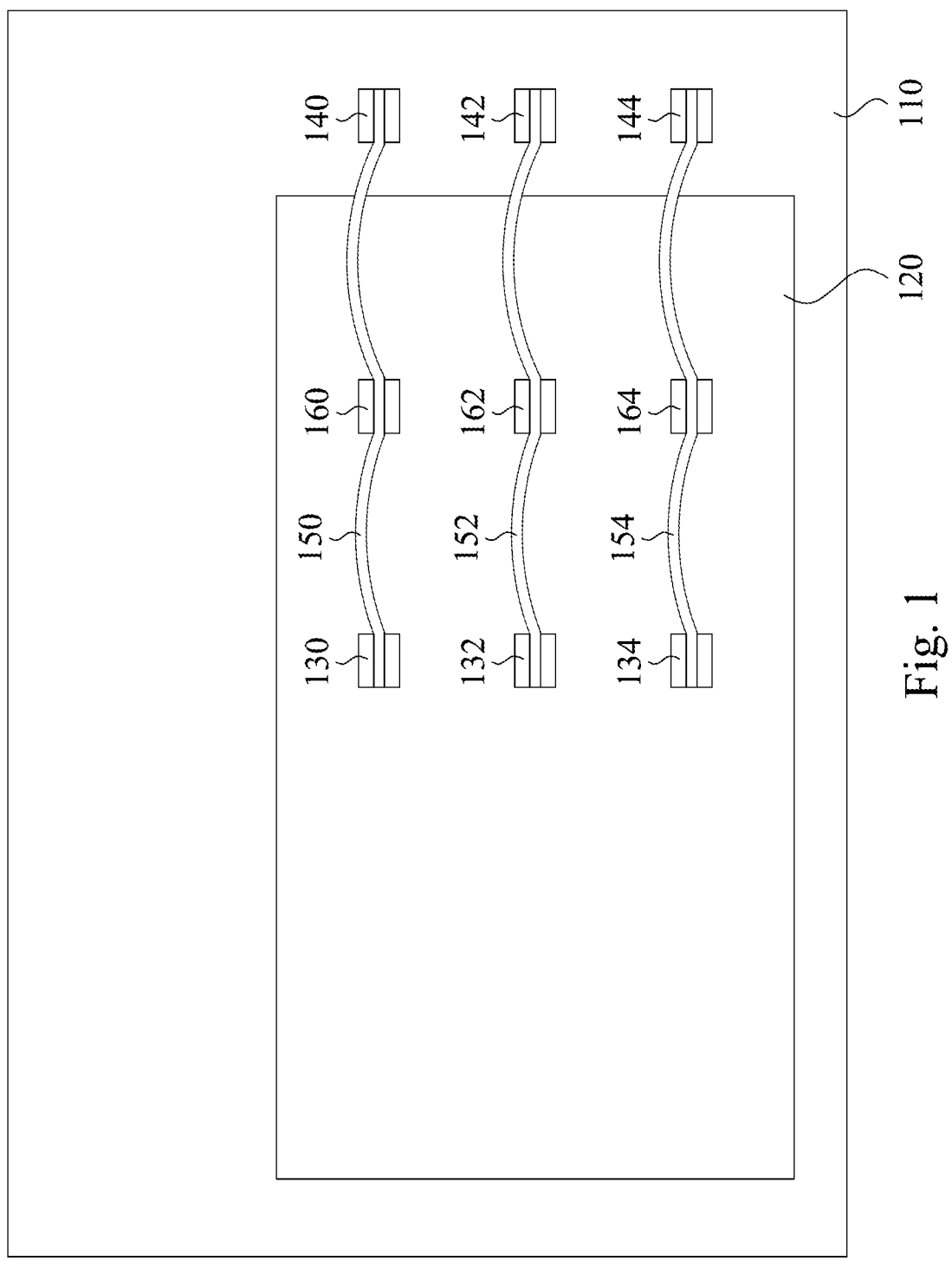
FIG. 1 is a top view of a printed circuit board structure in accordance with one embodiment of the present disclosure.

Reference will now be made in detail to the present embodiments of the disclosure, examples of which are illustrated in the accompanying drawings. Wherever possible, the same reference numbers are used in the drawings and the description to refer to the same or like parts.

FIG. 1 is a top view of a printed circuit board structure 100 in accordance with one embodiment of the present disclosure. Referring to FIG. 1, the printed circuit board (PCB) structure 100 includes a printed circuit board 110, a semiconductor chip 120, first pads 130, 132, and 134, second pads 140, 142, and 144, conductive wires 150, 152, and 154, and third pads 160, 162, and 164. As shown in FIG. 1, the conductive wires 150, 152, and 154 are substantially parallel with each other, but the present disclosure is not limited in this regard. In this embodiment, the first pads 130, 132, and 134 and the third pads 160, 162, and 164 are located on the semiconductor chip 120. The second pads 140, 142, and 144 are located on the printed circuit board 110. The conductive wire 150 is located on the first pad 130, the third pad 160, and the second pad 140. The conductive wire 152 is located on the first pad 132, the third pad 162, and the second pad 142. The conductive wire 154 is located on the first pad 134, the third pad 164, and the second pad 144. The number of the pads and the number of the conductive wires may be determined as deemed necessary by designers.

Figure 2:
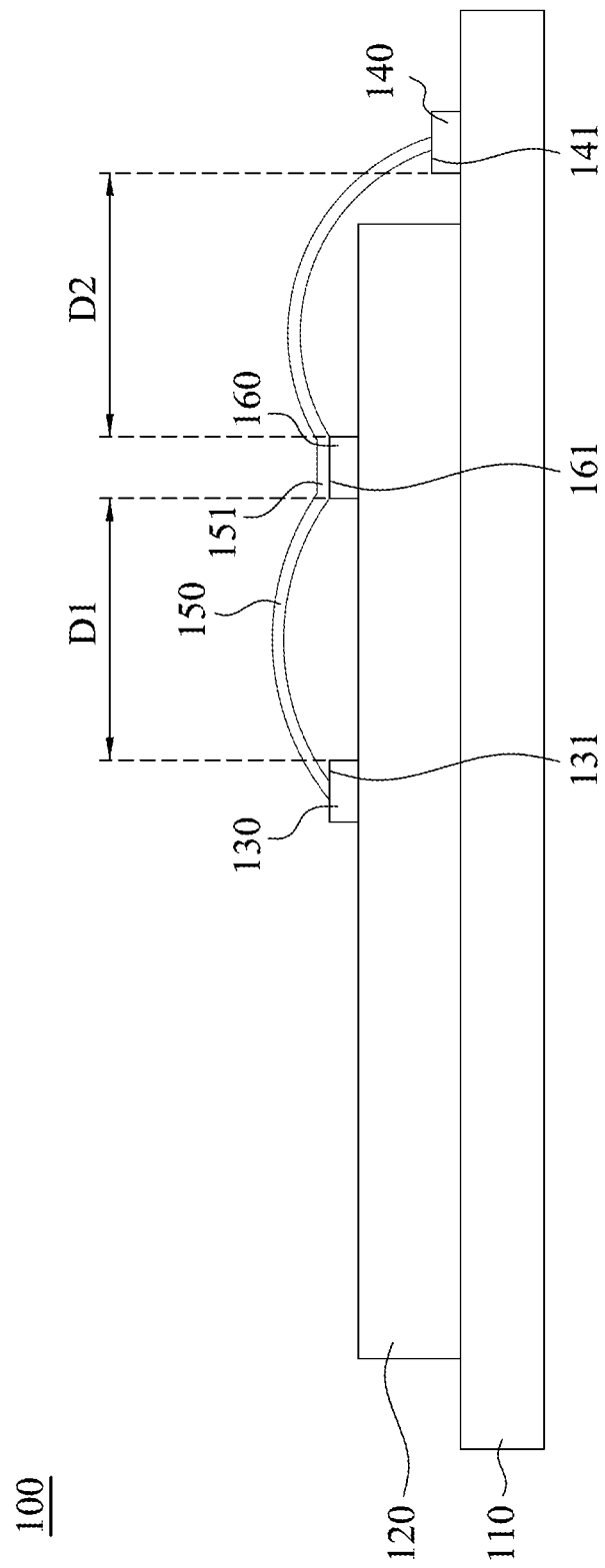
FIG. 2 is a side view of the printed circuit board structure of FIG. 1.

FIG. 2 is a cross-sectional view of the printed circuit board structure 100 of FIG. 1. For clarify, FIG. 2 merely illustrates the first pad 130, the second pad 140, the conductive wire 150, and the third pad 160, while the first pads 132 and 134, the conductive wires 152 and 154, and the third pads 162 and 164 are not shown.

Referring to FIG. 1 and FIG. 2, the semiconductor chip 120 is disposed on the printed circuit board 110. The first pad 130 is disposed on the semiconductor chip 120. The second pad 140 is disposed on the printed circuit board 110. In other words, a horizontal level of the first pad 130 is different from a horizontal level of the second pad 140. Stated differently, the horizontal level of the first pad 130 is higher than the horizontal level of the second pad 140 from the printed circuit board 110. The conductive wire 150 electrically connects the first pad 130 and the second pad 140. The third pad 160 is disposed between the first pad 130 and the second pad 140. The conductive wire 150 has a portion 151 located on the third pad. In greater details, the portion 151 of the conductive wire 150 is located on the third pad 160 such that the conductive wire 150 would not float above the semiconductor chip 120. As a result of such a configuration, the conductive wire crossing problem and the wire-to-wire short can be solved, and thus the signal and the performance of the printed circuit board structure 100 can be improved.

In some embodiments, a distance D1 between the first pad 130 and the third pad 160 is substantially equal to a distance D2 between the second pad 140 and the third pad 160 in a horizontal direction. In other words, the portion 151 of the conductive wire 150 is a middle portion of the conductive wire 150.

In some embodiments, the third pad 160 is disposed on the semiconductor chip 120. In greater details, the first pad 130 and the third pad 160 are in contact with the semiconductor chip 120, while the second pad 140 is in contact with the printed circuit board 110.

In some embodiments, the first pad 130 is electrically connected to the semiconductor chip 120. The second pad 140 is electrically connected to the printed circuit board 110. For example, the first pad 130 and the second pad 140 are bonding pads to provide electrical connections through the conductive wire 150.

In some embodiments, the third pad 160 is electrically isolated from the conductive wire 150. In some embodiments, the third pad 160 is electrically isolated from the semiconductor chip 120. For example, the third pad 160 is a dummy pad.

In some embodiments, a top surface 161 of the third pad 160 is substantially coplanar with a top surface 131 of the first pad. In other words, the horizontal level of the third pad 160 is the same as the horizontal level of the first pad 130. In some embodiments, the top surface 161 of the third pad 160 is higher than a top surface 141 of the second pad 140. In other words, the horizontal level of the third pad 160 is higher than the horizontal level of the second pad 140 due to the thickness of the semiconductor chip 120.

In some embodiments, the portion 151 of the conductive wire 150 is in contact with the third pad 160. For example, the portion 151 of the conductive wire 150 is fixed on the third pad 160 to prevent the conductive wire 150 from floating above the semiconductor chip 120. In some embodiments, the portion 151 of the conductive wire 150 covers the third pad 160.

Figure 3:
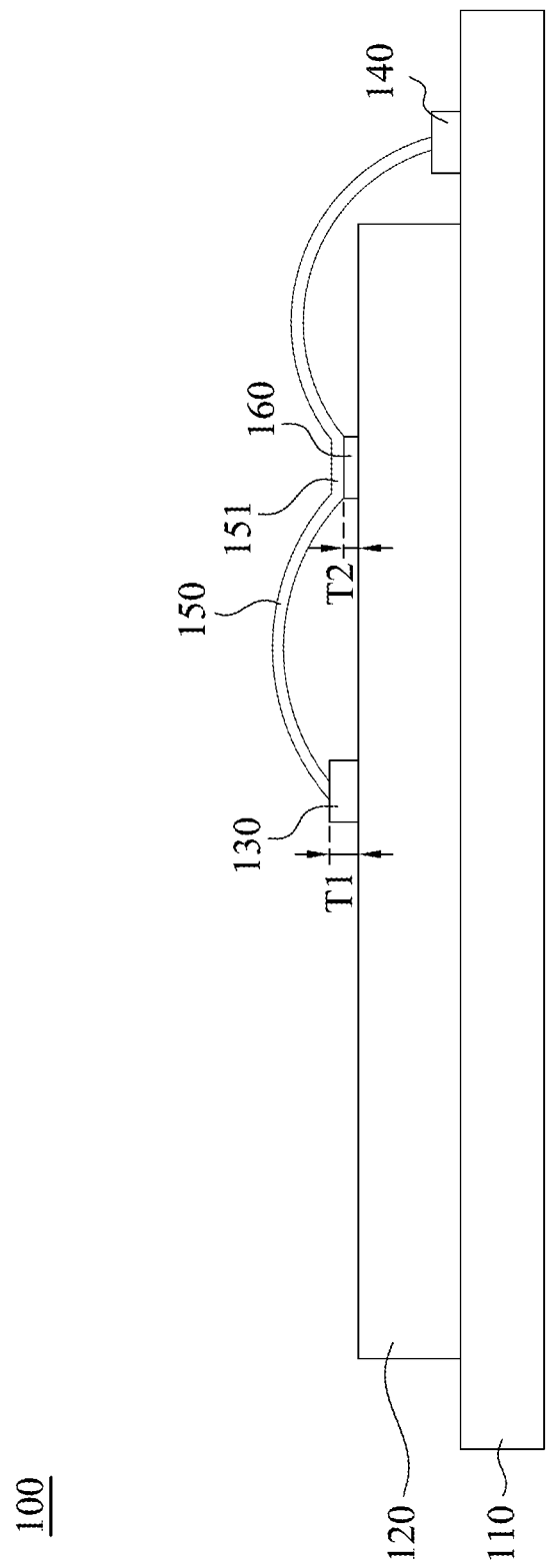
FIG. 3 is a printed circuit board structure in accordance with another embodiment of the present disclosure.

As shown in FIG. 3, the third pad 160 is a colloid, and the colloid is isolated from the conductive wire 150 and the semiconductor chip 120. The colloid has viscosity, thereby causing the portion 151 of the conductive wire 150 to fix on the colloid. In some embodiments, the colloid is a double sided tape. Furthermore, the conductive wire 150 may be made of a material including gold. In some embodiments, the first pad 130 has a thickness T1, and the third pad 160 has a thickness T2. The thickness T2 of the third pad 160 is less than the thickness T1 of the first pad 130.

Depending on the size of the semiconductor chip 120, the number of the third pad 160 may be two, three, or more. For example, the printed circuit board structure 100 may include three third pads 160, and the three third pads 160 are disposed between the first pad 130 and the second pad 140, in which every two adjacent third pads 160 have the same interval therebetween.

It is to be noted that the connection relationships and materials of the elements described above will not be repeated in the following description, and only aspects related to other types of third pads will be described.

Figure 4:
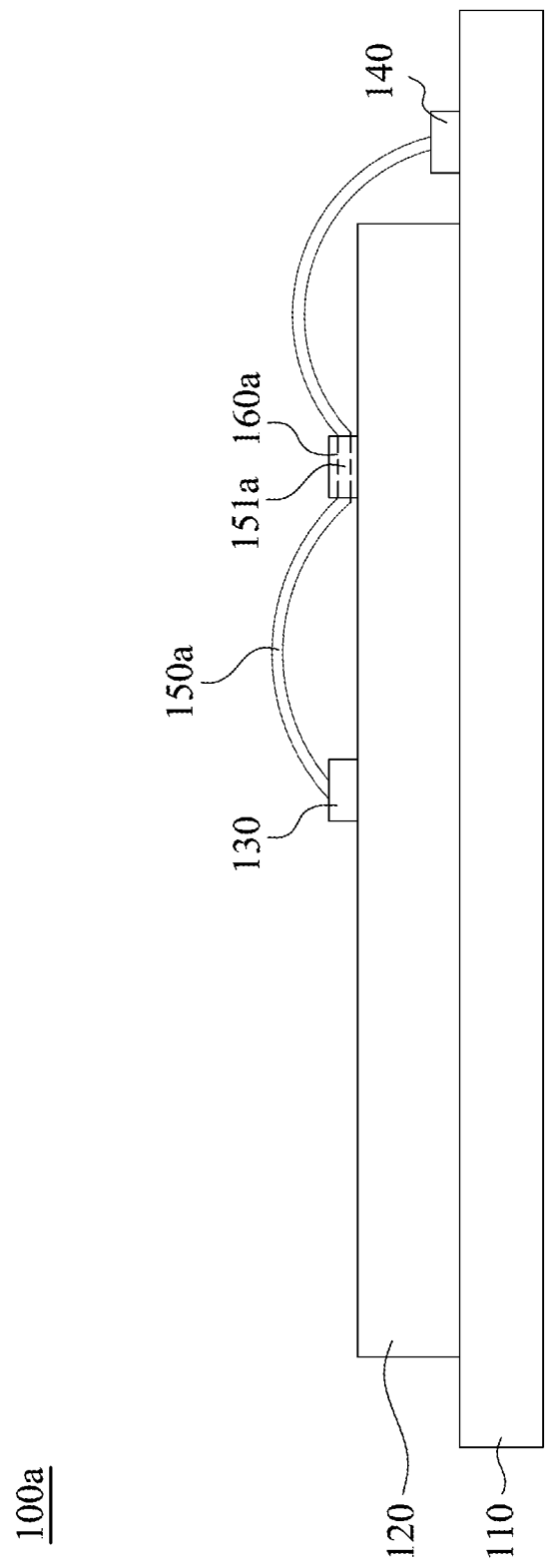
FIG. 4 is a printed circuit board structure in accordance with another embodiment of the present disclosure.

FIG. 4 is a printed circuit board structure 100a in accordance with another embodiment of the present disclosure. As shown in FIG. 4, the printed circuit board structure 100a includes a printed circuit board 110, a semiconductor chip 120, a first pad 130, a second pad 140, a conductive wire 150a and a third pad 160a. The third pad 160a is located on the semiconductor chip 120. The difference between the printed circuit board structure 100a of FIG. 4 and the printed circuit board structure 100 of FIG. 2 is that the conductive wire 150a is disposed through the third pad 160a. In greater details, the conductive wire 150a has a portion 151a. The portion 151a of the conductive wire 150a is embedded in the third pad 160a.

In some embodiments, the third pad 160a is a colloid. The conductive wire 150a is disposed through the colloid. In other words, the colloid surrounds the portion 151a of the conductive wire 150a. In some embodiments, the colloid is engaged with the conductive wire 150a, such as the portion 151a of the conductive wire 150a, so as to prevent the conductive wire 150a from floating above the semiconductor chip 120.

Figure 5:
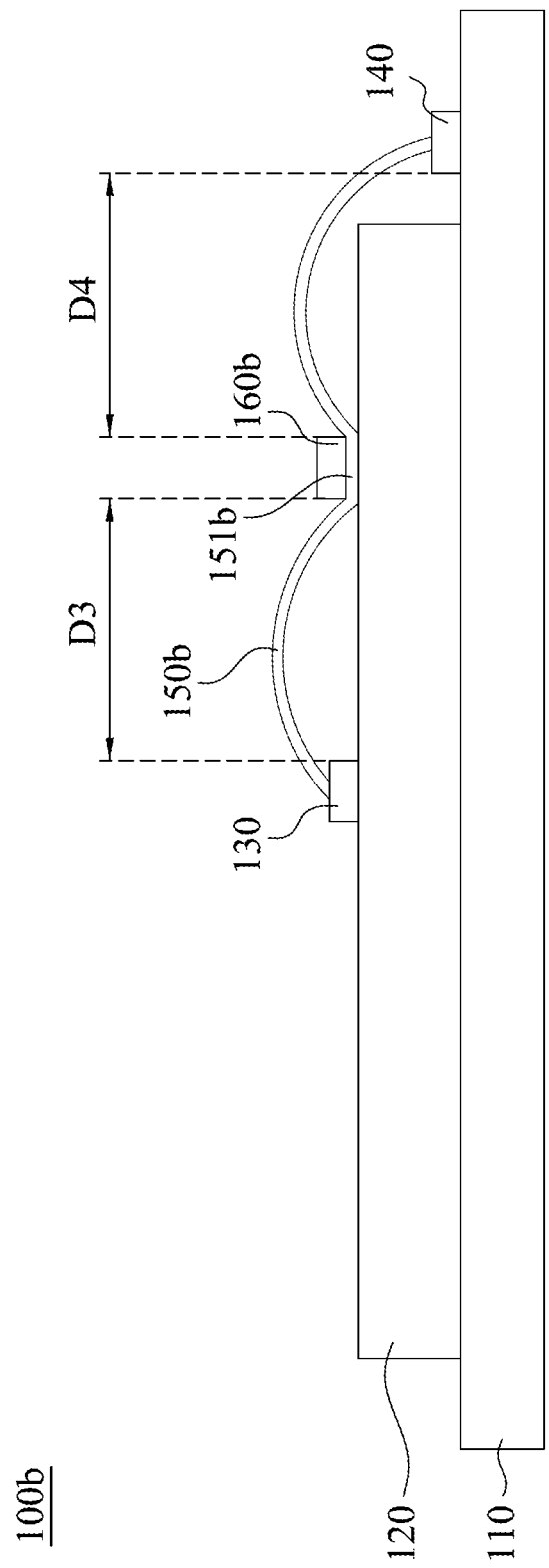
FIG. 5 is a printed circuit board structure in accordance with another embodiment of the present disclosure.

FIG. 5 is a printed circuit board structure 100b in accordance with another embodiment of the present disclosure. As shown in FIG. 5, the printed circuit board structure 100b includes the printed circuit board 110, the semiconductor chip 120, the first pad 130, the second pad 140, and a conductive wire 150b. The semiconductor chip 120 is disposed on the printed circuit board 110. The first pad 130 is disposed on the semiconductor chip 120. The second pad 140 is disposed on the printed circuit board 110. The conductive wire 150b electrically connects the first pad 130 and the second pad 140, and has a portion 151b fixed on the semiconductor chip 120. As such, the conductive wire 150b would not float above the semiconductor chip 120, the conductive wire crossing problem and the wire-to-wire short can be solved, and thus the signal and the performance of the printed circuit board structure 100b can be improved.

In some embodiments, the printed circuit board structure 100b further includes an adhesive tape 160b on the semiconductor chip 120, and the adhesive tape 160b overlaps the portion 151b of the conductive wire 150b. The adhesive tape 160b may replace the third pad 160 of FIG. 2 and third pad 160a of FIG. 3.

In some embodiments, a distance D3 between the first pad 130 and the portion 151b of the conductive wire 150b is substantially equal to a distance D4 between the second pad 140 and the portion 151b of the conductive wire 150b in a horizontal direction. In other words, the portion 151b of the conductive wire 150b is a middle portion of the conductive wire 150b.

In some embodiments, the portion 151b of the conductive wire 150b is fixed on the semiconductor chip 120 by melting the portion 151b of the conductive wire 150b. As such, the portion 151b of the conductive wire 150b further has viscosity which is beneficial for the portion 151b of the conductive wire 150b to fix on, such as stick on, the semiconductor chip 120.

In summary, because the printed circuit board structure includes the semiconductor chip, the first pad, the second pad, and the conductive wire, and selectively includes the third pad or the adhesive tape, the conductive wire can has a middle portion located on the semiconductor chip instead of floating above the semiconductor chip. As a result of such a configuration, the conductive wire crossing problem and the wire-to-wire short can be solved and thus the signal and the performance of the printed circuit board structure can be improved.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A printed circuit board structure, comprising:
    a printed circuit board;
    a semiconductor chip disposed on the printed circuit board;
    a first pad disposed on and electrically connected to the semiconductor chip;
    a second pad disposed on the printed circuit board;
    a conductive wire electrically connecting the first pad and the second pad; and
    a third pad disposed between the first pad and the second pad, wherein the conductive wire has a portion located on the third pad, and wherein the third pad is electrically isolated from the semiconductor chip.

2. The printed circuit board structure of claim 1, wherein a distance between the first pad and the third pad is substantially equal to a distance between the second pad and the third pad in a horizontal direction.

3. The printed circuit board structure of claim 1, wherein the third pad is disposed on the semiconductor chip.

4. The printed circuit board structure of claim 1, wherein the second pad is electrically connected to the printed circuit board.

5. The printed circuit board structure of claim 1, wherein the third pad is electrically isolated from the conductive wire.

6. The printed circuit board structure of claim 1, wherein a top surface of the third pad is substantially coplanar with a top surface of the first pad.

7. The printed circuit board structure of claim 1, wherein a top surface of the third pad is higher than a top surface of the second pad.

8. The printed circuit board structure of claim 1, wherein the portion of the conductive wire is in contact with the third pad.

9. The printed circuit board structure of claim 1, wherein the third pad is a colloid.

10. The printed circuit board structure of claim 9, wherein the colloid is a double sided tape.

11. The printed circuit board structure of claim 1, wherein the third pad has a thickness less than the first pad.

12. The printed circuit board structure of claim 1, wherein the conductive wire is made of a material comprising gold.

13. A printed circuit board structure, comprising:
    a printed circuit board;
    a semiconductor chip disposed on the printed circuit board;
    a first pad disposed on the semiconductor chip;
    a second pad disposed on the printed circuit board; and
    a conductive wire electrically connecting the first pad and the second pad, wherein the conductive wire has a portion fixed on and in direct contact with the semiconductor chip, and other portions of the conductive wire are spaced apart from the semiconductor chip.

14. The printed circuit board structure of claim 13, further comprising:
    an adhesive tape on the semiconductor chip and overlapping the portion of the conductive wire.

15. The printed circuit board structure of claim 13, wherein a distance between the first pad and the portion of the conductive wire is substantially equal to a distance between the second pad and the portion of the conductive wire in a horizontal direction.

* * * * *